United States Patent
Yoshioka

(10) Patent No.: US 12,451,846 B2
(45) Date of Patent: Oct. 21, 2025

(54) HIGH-FREQUENCY, MULTISTAGE, LOW-NOISE AMPLIFIER

(71) Applicant: Mitsubishi Electric Corporation, Tokyo (JP)

(72) Inventor: Takaaki Yoshioka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 626 days.

(21) Appl. No.: 17/760,179

(22) PCT Filed: Jul. 27, 2020

(86) PCT No.: PCT/JP2020/028728
§ 371 (c)(1),
(2) Date: Aug. 4, 2022

(87) PCT Pub. No.: WO2022/024189
PCT Pub. Date: Feb. 3, 2022

(65) Prior Publication Data
US 2023/0066275 A1    Mar. 2, 2023

(51) Int. Cl.
*H03F 1/42* (2006.01)
*H03F 1/56* (2006.01)
(Continued)

(52) U.S. Cl.
CPC ............ *H03F 1/42* (2013.01); *H03F 1/565* (2013.01); *H03F 3/195* (2013.01); *H03F 3/245* (2013.01);
(Continued)

(58) Field of Classification Search
CPC . H03F 1/42; H03F 1/565; H03F 3/195; H03F 3/245; H03F 3/68; H03F 2200/267;
(Continued)

(56) References Cited

U.S. PATENT DOCUMENTS 6,317,003 B1    11/2001    Kobayashi
2018/0331664 A1    11/2018    Yoshioka et al.

FOREIGN PATENT DOCUMENTS

JP    H10-322155 A    12/1998
JP    2000-269754 A    9/2000
WO    2017/098580 A1    6/2017

OTHER PUBLICATIONS

International Search Report issued in PCT/JP2020/028728; mailed Sep. 1, 2020.

*Primary Examiner* — Andrea Lindgren Baltzell
*Assistant Examiner* — Nareh Shamiryan
(74) *Attorney, Agent, or Firm* — Studebaker Brackett PLLC

(57) ABSTRACT

An amplifier includes: a high-frequency input terminal; a high-frequency output terminal; a multistage circuit provided between the high-frequency input terminal and the high-frequency output terminal and including two or more amplifiers and connected in series, each amplifier including an input matching circuit, a transistor, and an output matching circuit; a stabilizing circuit provided in at least two of the amplifiers and including a bandpass filter and a resistor connected in parallel; and a band-rejection filter provided between the at least two of amplifiers and eliminating a frequency lower than an operation frequency of the amplifier. The stabilizing circuit and the band-rejection filter are provided between an output terminal of the transistor of the amplifier and the output matching circuit or provided in the output matching circuit. The closer to the high-frequency input terminal the bandpass filter is, the lower a resonance frequency of the bandpass filter is.

10 Claims, 11 Drawing Sheets

(51) Int. Cl.
*H03F 3/195* (2006.01)
*H03F 3/24* (2006.01)
*H03F 3/68* (2006.01)

(52) U.S. Cl.
CPC ......... *H03F 3/68* (2013.01); *H03F 2200/267* (2013.01); *H03F 2200/294* (2013.01); *H03F 2200/36* (2013.01); *H03F 2200/451* (2013.01)

(58) Field of Classification Search
CPC ........... H03F 2200/294; H03F 2200/36; H03F 2200/451
USPC .................................. 330/98, 133, 310, 302
See application file for complete search history.

HIGH-FREQUENCY, MULTISTAGE, LOW-NOISE AMPLIFIER

FIELD

The present disclosure relates to a high-frequency, multistage, low-noise amplifier.

BACKGROUND

High-frequency, low-noise amplifiers require low noise in the amplified and output high-frequency signal and stability over the range from a low frequency region to a high frequency region outside an operation frequency band. As an amplifier of this type, for example, PTL 1 shows an amplifier formed of a first stabilizing circuit in which two or more transistors are connected in series to each other and a first bandpass filter that transmits a frequency f1 lower than a center value fc of the operation frequency of the amplifier is connected in parallel to a first resistor; and a second stabilizing circuit in which a second bandpass filter that transmits a frequency f2 higher than the frequency fc is connected in parallel to a second resistor.

The thus configured amplifier, in which a plurality of transistors are directly connected to each other, reduces the passage loss produced over the range from the low frequency end to the high frequency end of the operation band with the stability outside the operation band maintained, resulting in a low noise factor over a wide band and satisfactory gain flatness over the operation band.

CITATION LIST

Patent Literature

[PTL 1] WO2017/098580

SUMMARY

Technical Problem

High-frequency, low-noise amplifiers of related art are configured as described above and are therefore not designed to employ a configuration in which a band-rejection filter is disposed to reduce the gain in a specific band. Therefore, when a band-rejection filter is disposed to reduce the gain at frequencies in the vicinity of the operation frequency band, the resultant circuit loss causes a problem of a worsened noise factor at the operation frequency.

Specifically, in satellite communication or terrestrial base station communication, to ensure the quality of the communication, a band-rejection filter is provided in some cases to eliminate a frequency band in the vicinity of the operation band of an amplifier but different from the operation band, for example, for improvement in the distortion characteristic of the amplifier and elimination of unwanted waves. A band-rejection filter attenuates the gain in the eliminated band, which contains frequencies outside the operation band. In general, when a band-rejection filter is disposed, a circuit loss occurs at the resonance frequency of the filter, and the gain of the amplifier attenuates at that frequency. Since it is practically impossible to attenuate the gain only at a single frequency, a circuit loss also occurs in the operation band, affecting the gain or the noise factor in the operation band of the amplifier in some cases. For example, in an amplifier that operates in an operation band ranging from 14 to 16 GHz, providing a band-rejection filter having a center frequency of 13 GHz, which is close to the operation band, the gain at 13 GHz can be reduced by the effect of the band-rejection filter. However, the attenuation characteristic of the filter sweeps along the axis of the frequency, resulting in a circuit loss in the operation band as well. In the example described above, in which the eliminated band is lower in terms of frequency than the operation band, there are problems of reduced gain and a poor noise factor at 14 GHz, which is the low frequency end of the operation band.

The present disclosure has been made to solve the problems described above, and an object of the present disclosure is to provide a high-frequency, multistage, low-noise amplifier including a band-rejection filter and capable of providing a low noise factor and a flat gain characteristic over the range from the low frequency end to the high frequency end of the operation band.

Solution to Problem

A high-frequency, multistage, low-noise amplifier according to the present disclosure includes: a high-frequency input terminal; a high-frequency output terminal; a multistage circuit provided between the high-frequency input terminal and the high-frequency output terminal and including two or more amplifiers connected in series to each other, each amplifier including an input matching circuit, a transistor, and an output matching circuit; a stabilizing circuit provided in at least two of the amplifiers of the multistage circuit and including a bandpass filter and a resistor connected in parallel to each other; and a band-rejection filter provided between the at least two of amplifiers and eliminating a frequency lower than an operation frequency of the amplifier, wherein the stabilizing circuit and the band-rejection filter are provided between an output terminal of the transistor of the amplifier and the output matching circuit or provided in the output matching circuit, and the closer to the high-frequency input terminal the bandpass filter is, the lower a resonance frequency of the bandpass filter is.

According to another example, a high-frequency, multistage, low-noise amplifier according to the present disclosure includes: a high-frequency input terminal; a high-frequency output terminal; a multistage circuit provided between the high-frequency input terminal and the high-frequency output terminal and including two or more amplifiers connected in series to each other, each amplifier including an input matching circuit, a transistor, and an output matching circuit; a stabilizing circuit provided in at least two of the amplifiers of the multistage circuit and including a bandpass filter and a resistor connected in parallel to each other; and a band-rejection filter provided between the at least two of amplifiers and eliminating a frequency higher than an operation frequency of the amplifier, wherein the stabilizing circuit and the band-rejection filter are provided between an output terminal of the transistor of the amplifier and the output matching circuit or provided in the output matching circuit, and the closer to the high-frequency input terminal the bandpass filter is, the higher a resonance frequency of the bandpass filter is.

Advantageous Effects of Invention

In the present disclosure, when the band-rejection filter eliminates the frequency component lower than the operation frequency of the amplifier, the closer to the high-frequency input terminal the bandpass filter is, the lower the resonance frequency of the bandpass filter is. When the band-rejection filter eliminates the frequency component higher than the operation frequency of the amplifier, the closer to the high-frequency input terminal the bandpass filter is, the higher the resonance frequency of the bandpass filter is. Therefore, it is possible to obtain a low noise factor and a flat gain characteristic over the range from the low frequency end to the high frequency end of the operation band.

DESCRIPTION OF EMBODIMENTS

Figure 1:
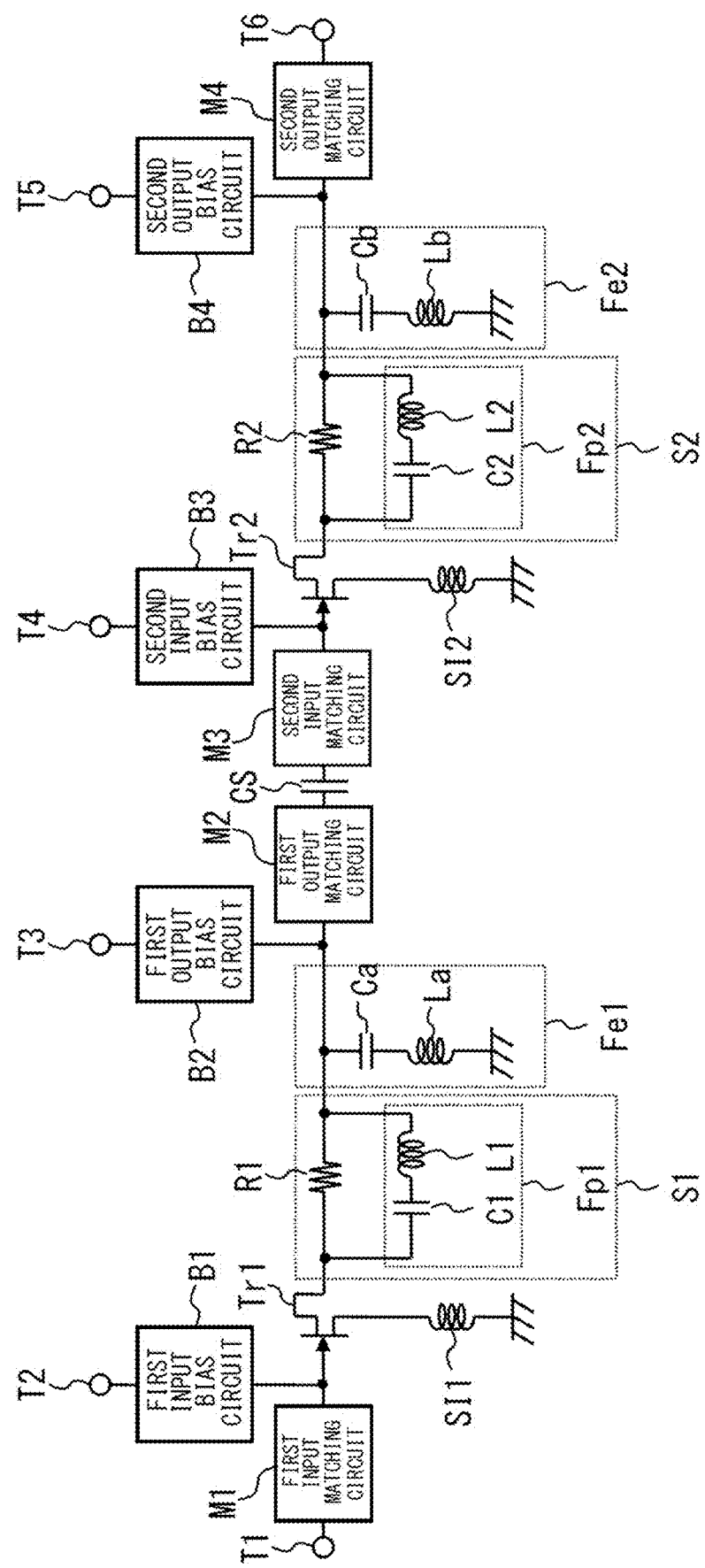
FIG. 1 is a configuration diagram of a high-frequency, multistage, low-noise amplifier according to a first embodiment.

A high-frequency, multistage, low-noise amplifier according to embodiments will be described with reference to the drawings. The same component or a corresponding component has the same reference character, and no repeated description of the component will be made in some cases. The high-frequency, multistage, low-noise amplifier according to the embodiments relates to a high-frequency power amplifier that amplifies a high-frequency signal, for example, a microwave or a millimeter wave, and particularly to a high-frequency, multistage, low-noise amplifier in which two or more transistors and matching circuits are connected in series to each other and which amplifies a low-power, high-frequency signal containing a small amount of noise.

First Embodiment

FIG. 1 is a configuration diagram of a high-frequency, multistage, low-noise amplifier according to a first embodiment. The high-frequency, multistage, low-noise amplifier has a high-frequency input terminal T1, a high-frequency output terminal T6, and a multistage circuit provided between the high-frequency input terminal T1 and the high-frequency output terminal T6. The high-frequency input terminal T1 is a terminal via which a high-frequency signal is input to the high-frequency, multistage, low-noise amplifier. The high-frequency output terminal T6 is an output terminal of the high-frequency, multistage, low-noise amplifier. The multistage circuit is formed of two or more amplifiers connected in series to each other, each amplifier including an input matching circuit, a transistor, and an output matching circuit. The number of amplifiers provided in the multistage circuit is not limited to a specific number.

In the example shown in FIG. 1, the multistage circuit includes a first-stage amplifier and a second-stage amplifier. The first-stage amplifier includes a first input matching circuit M1, a first input bias circuit B1, a first input bias power supply terminal T2, a first transistor Tr1, a first source inductor SI1, a first stabilizing circuit S1, a first band-rejection filter Fe1, a first output bias circuit B2, a first output bias power supply terminal T3, and a first output matching circuit M2.

The first-stage amplifier and the second-stage amplifier are connected to each other via an interstage capacitor Cs. The second-stage amplifier includes a second input matching circuit M3, a second input bias circuit B3, a second input bias power supply terminal T4, a second transistor Tr2, a second source inductor SI2, a second stabilizing circuit S2, a second band-rejection filter Fe2, a second output bias circuit B4, a second output bias power supply terminal T5, and a second output matching circuit M4.

The components that form the portion from the first input matching circuit M1 to the first output matching circuit M2 form the first-stage amplifier viewed from the side facing the high-frequency input terminal T1. The first input matching circuit M1 is a matching circuit on the side facing the input of the first transistor Tr1. The first input bias circuit B1 is a circuit that provides the gate terminal of the first transistor Tr1 with a bias voltage. The first input bias power supply terminal T2 is a terminal via which the power is supplied to the first input bias circuit B1. The first transistor Tr1 is an amplification element that amplifies the high-frequency signal. One end of the first source inductor SI1 is connected to the source terminal of the first transistor Tr1, and the other end of the first source inductor SI1 is grounded.

The first stabilizing circuit S1 is provided between the first transistor Tr1 and the first output matching circuit M2. The first stabilizing circuit S1 has a configuration in which a resonance circuit in which a first inductor L1, which resonates at a frequency f1, and a first capacitor C1 are connected in series to each other is connected in parallel to a first resistor R1.

The first band-rejection filter Fe1 is provided between the first transistor Tr1 and the first output matching circuit M2, as the first stabilizing circuit S1 is. The first band-rejection filter Fe1 and the first stabilizing circuit S1 may instead be provided in the first output matching circuit M2. The first band-rejection filter Fe1 is formed of a resonance circuit in which an inductor La, which resonates at a frequency fr, is connected in series to a capacitor Ca and which is shunt-connected.

The first output bias circuit B2 is a circuit that provides the drain terminal of the first transistor Tr1 with a bias voltage. The first output bias power supply terminal T3 is a terminal via which the power is supplied to the first output bias circuit B2. The first output matching circuit M2 is a matching circuit on the side facing the output of the first transistor Tr1. The interstage capacitor Cs is a DC cutoff capacitor that blocks DC signals from the first output matching circuit M2 and the second input matching circuit M3.

The components that form the portion from the second input matching circuit M3 to the second output matching circuit M4 form the second-stage amplifier viewed from the side facing the high-frequency input terminal T1. The configuration of the second-stage amplifier is the same as the configuration of the first-stage amplifier. The second stabilizing circuit S2 has a configuration in which a resonance circuit in which a second inductor L2, which resonates at a frequency f2, and a second capacitor C2 are connected in series to each other is connected in parallel to a second resistor R2. The second band-rejection filter Fe2 is formed of a resonance circuit in which an inductor Lb having the same inductance as that of the inductor La is connected in series to a capacitor Cb having the same capacitance as that of the capacitor Ca and which is shunt-connected. The resonance frequency of the second band-rejection filter Fe2 is therefore equal to the resonance frequency fr of the first band-rejection filter Fe1.

Now, if fc is defined as the center value of the operation frequency of amplifier, the relationship among the frequency f1, the frequency f2, and the frequency fr is $fr \leq f1 < fc < f2$.

A low-noise amplifier uses in many cases a source inductor to be stabilized in the operation band. The provided source inductor impairs the stability on the high-frequency side of the operation band. It is therefore necessary to insert a stabilizing circuit having passage loss not only on the low-frequency side of the operational band but also on the high-frequency side thereof. Furthermore, the transistor that form each stage needs to be stabilized, the first stabilizing circuit S1 and the second stabilizing circuit S2 must not be connected in series to each other in succession. The first stabilizing circuit S1 is provided between the output terminal of the first transistor Tr1 and the first output matching circuit M2 or inside the first output matching circuit M2. The second stabilizing circuit S2 is provided between the output terminal of the second transistor Tr2 and the second output matching circuit M4 or inside the second output matching circuit M4.

In addition, the first band-rejection filter Fe1 and the second band-rejection filter Fe2 are not connected in series to each other in succession, but the first band-rejection filter Fe1 is provided between the output terminal of the first transistor Tr1 and the first output matching circuit M2 or inside the first output matching circuit M2. The second band-rejection filter Fe2 can then be provided between the output terminal of the second transistor Tr2 and the second output matching circuit M4 or inside the second output matching circuit M4. The configuration described above prevents high-frequency signals from being excessively input to all the transistors and allows the distortion characteristic to improve on an amplification stage basis.

In the configuration described above, the LC-series resonance circuit in the first stabilizing circuit S1 functions as a first bandpass filter Fp1, which transmits power at the frequency f1. When the LC-series resonance circuit and the first resistor R1 are connected in parallel to each other, the resonance circuit serves as a bandpass filter at the resonance frequency f1 of the LC-series resonance circuit, and the passage loss is ideally zero.

On the other hand, when the frequency changes from f1 to a value separate from f1, the input signal propagates via the first resistor R1 disposed in parallel to the LC-series resonance circuit, resulting in an increase in the circuit loss, whereby the amplifier is stabilized.

Similarly, the LC-series resonance circuit in the second stabilizing circuit S2 functions as a second bandpass filter Fp2, which transmits power at the frequency f2. At the frequency f2, the resonance circuit serves as a bandpass filter, and the passage loss is ideally zero.

On the other hand, when the frequency changes from f2 to a value separate from f2, the input signal propagates via the second resistor R2 disposed in parallel to the LC-series resonance circuit, resulting in an increase in the circuit loss, whereby the amplifier is stabilized.

The first band-rejection filter Fe1 and the second band-rejection filter Fe2 each function as a band-rejection filter that eliminates power at the frequency fr. The circuit loss produced by the band-rejection filter has a frequency characteristic that provides a maximum value at the frequency fr and sweeps in the vicinity of the maximum value.

A description will next be made about effects on the gain flatness and the noise factor of the multistage amplifier in the case where the first stabilizing circuit S1, the first band-rejection filter Fe1, the second stabilizing circuit S2, and the second band-rejection filter Fe2 are connected in series to each other in the form of multiple stages. It is assumed in the description that the eliminated band is lower in terms of frequency than the operation band. On the assumption that the configuration in FIG. 1 is employed, examination will be made on the following three cases that satisfy the relationship in terms of magnitude among the frequency fr, at which the band-rejection filter produces the largest loss, the resonance frequency f1 of the LC resonance circuit that forms the first stabilizing circuit, the resonance frequency f2 of the LC resonance circuit that forms the second stabilizing circuit, and the center value fc of the operation frequency of the amplifier.

$fr < f1 = fc = f2$            Case (1)

$fr < f2 < fc < f1$            Case (2)

$fr < f1 < fc < f2$: First embodiment            Case (3)

The cases described above will be examined in conjunction with specific examples to see how the following values change: the circuit losses produced by the stabilizing circuits and the band-rejection filters; and the gain flatness and the noise factor in the operation band. It is assumed that the operation band ranges from 14 to 16 GHz, and that the eliminated band is 13 GHz.

Figure 2:
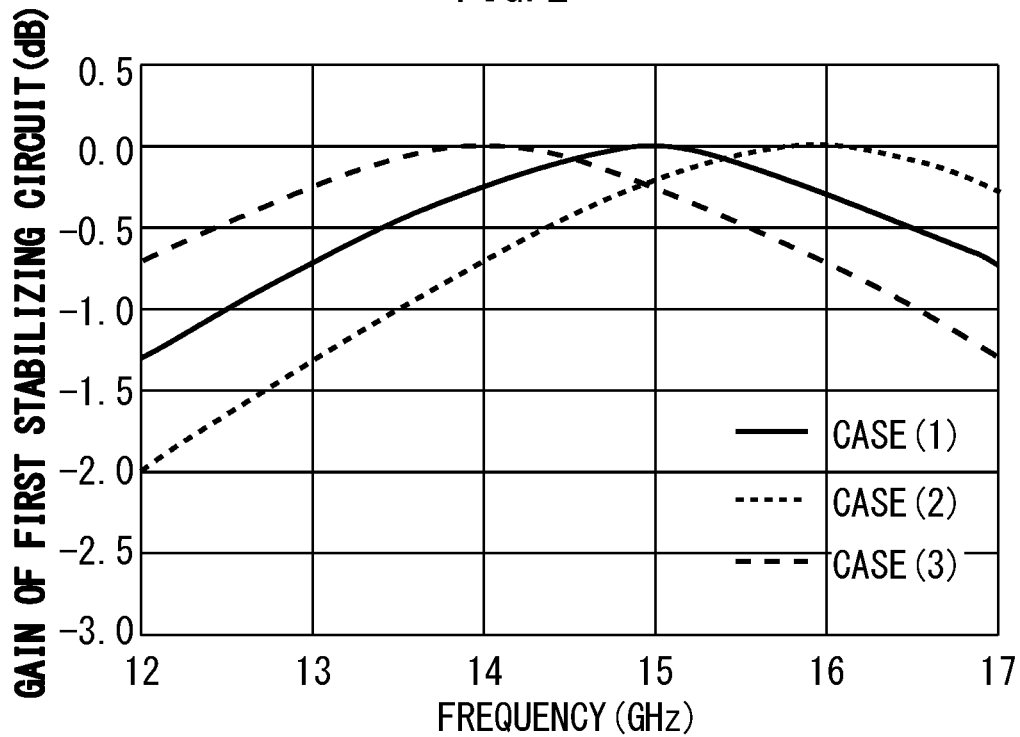
FIG. 2 shows the gain characteristics of the first stabilizing circuits according to the first embodiment and the comparative example.
Figure 3:
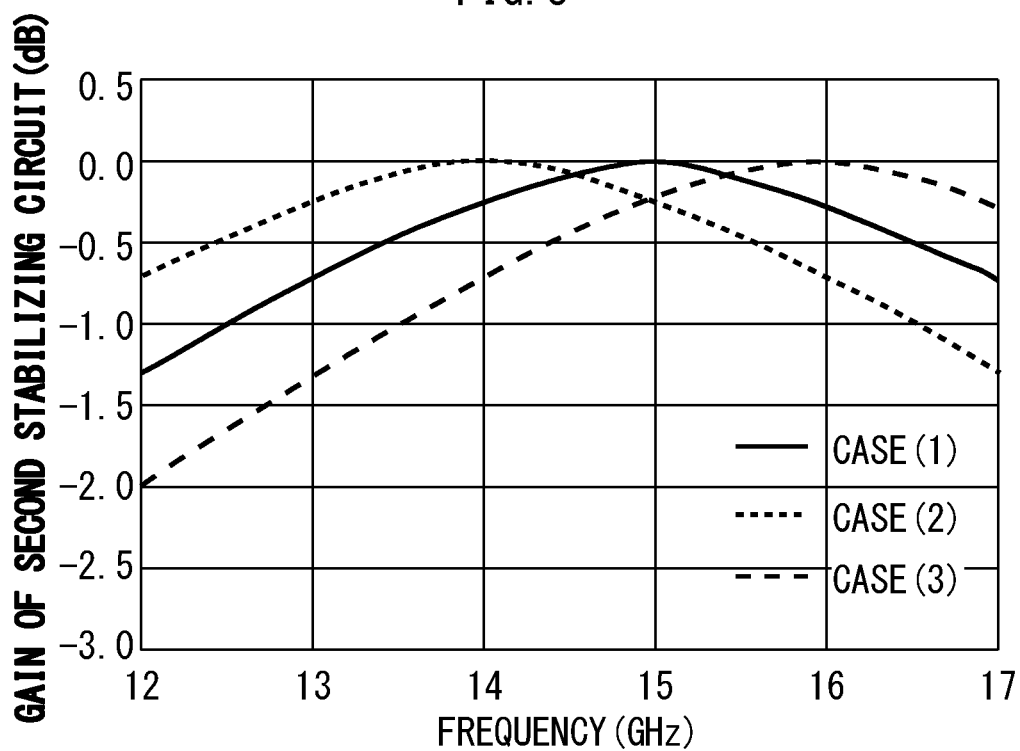
FIG. 3 shows the gain characteristics of the second stabilizing circuits according to the first embodiment and the comparative example.
Figure 4:
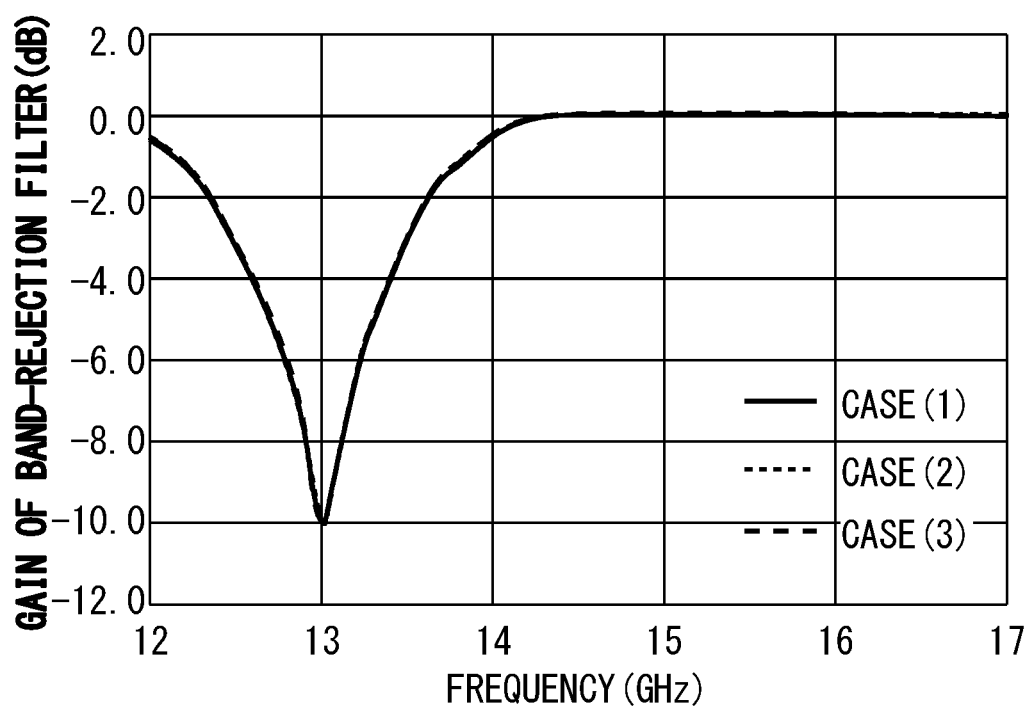
FIG. 4 shows the gain characteristics of the band-rejection filters according to the first embodiment and the comparative example.

FIG. 2 shows the gain characteristic of the first stabilizing circuit in the cases (1) to (3) described above. FIG. 3 shows the gain characteristic of the second stabilizing circuit in the cases (1) to (3) described above. FIG. 4 shows the gain characteristics of the first and second band-rejection filters in the cases (1) to (3) described above.

The circuit losses of the stabilizing circuits and the band-rejection filters correspond to the absolute values of the negative values shown in the figures. In this calculation example, the resonance frequencies of the LC resonance circuits that form the stabilizing circuits are so set that the first and second stabilizing circuits both produce a zero circuit loss at 15 GHz in the case (1), the first stabilizing circuit produces a zero circuit loss at 16 GHz, and the second stabilizing circuit produces a zero circuit loss at 14 GHz in the case (2), and the first stabilizing circuit produces a zero circuit loss at 14 GHz, and the second stabilizing circuit produces a zero circuit loss at 16 GHz in the case (3).

It is presumed that the amounts of attenuation provided by the band-rejection filters have a maximum circuit loss of 10 dB at 13 GHz and 0.6 dB at 14 GHz. On the presumption described above, the gain and the noise factor of the multistage amplifier are calculated on the assumption that the gain of a single transistor is 10 dB and the noise factor is 0.6 dB irrespective of the frequency at each stage, and that there is no circuit loss excluding those produced by the stabilizing circuits and band-rejection filters.

Figure 5:
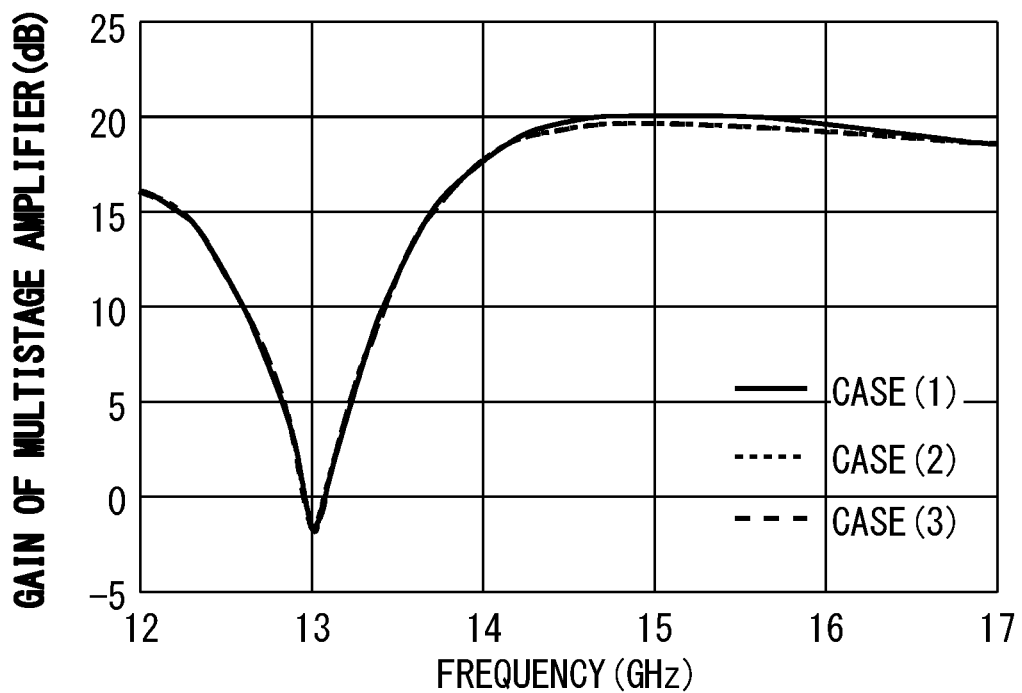
FIG. 5 shows the gains of the multistage amplifiers according to the first embodiment and the comparative example.

FIG. 5 shows the gain of the multistage amplifier in the cases (1) to (3) described above. FIG. 5 shows that the gain deviation between the first and second stabilizing circuits is eliminated, and that the gain deviation in the multistage amplifier in the operation bands is improved in the cases (2) and (3) as compared with that in the case (1). The effect described above is also shown in PTL 1.

Figure 6:
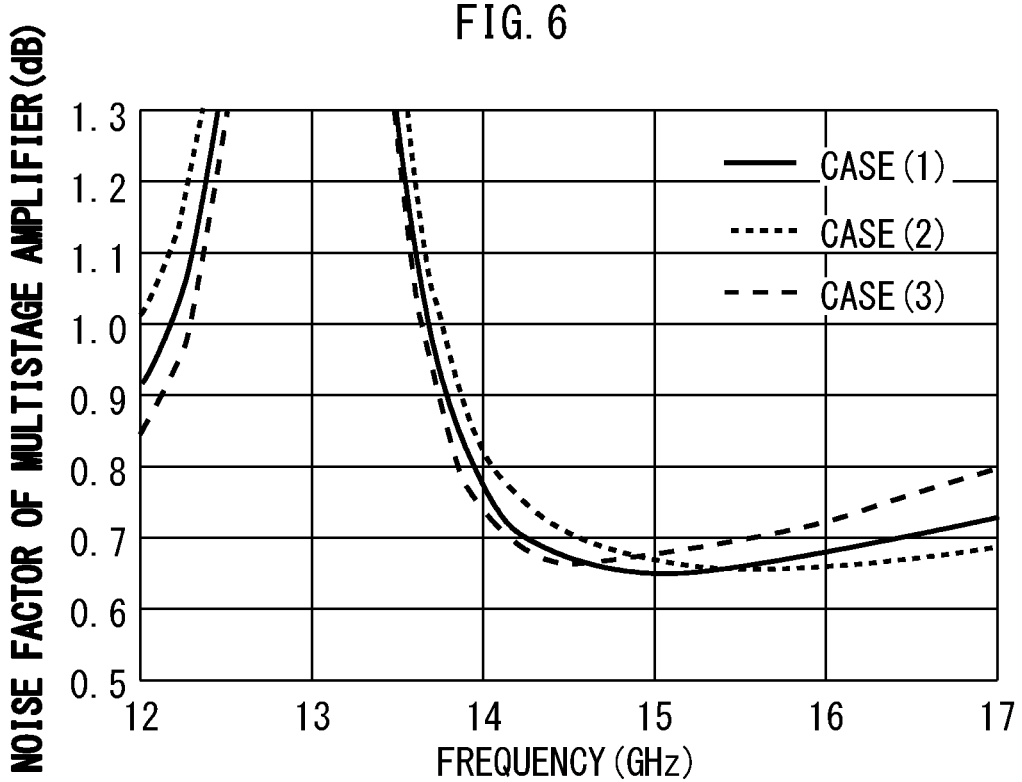
FIG. 6 shows the noise factors of the multistage amplifiers according to the first embodiment and the comparative example.

FIG. 6 shows the noise factor of the multistage amplifier in the cases (1) to (3) described above. The worst value of the noise factor in the operation band is 0.82 dB in the case (2), whereas the worst value is 0.74 dB in the case (3). The noise factor of a two-stage amplifier is typically calculated by the following equation:

$$F=F1+(F-2-1)/G1 \quad \text{(Expression 1)}$$

where F represents the noise factor of the two-stage amplifier, F1 and F2 represent the noise factors of the first-stage and second-stage amplifiers, and G1 represents the gain of the first-stage amplifier. According to Expression 1, even when the total circuit loss produced by the multistage circuit is fixed, the noise factor of the multistage amplifier worsens because the larger the circuit loss produced by the first-stage amplifier, the worse the noise factor of the first-stage amplifier. In other words, if the circuit loss produced by the first-stage amplifier can be reduced, the noise factor of the multistage amplifier can be improved even when the sum of circuit losses produced by all stages is fixed. The reason why the noise factor in the case (3) is lower than that in the case (2) is that the resonance frequency f1 is so set at a value lower than fc that the circuit loss produced by the first stabilizing circuit is small at the low frequency end of the operation band or 14 GHz, at which a circuit loss is produced by the first band-rejection filter. The circuit loss produced by the portion from the output terminal of the first transistor Tr1 to the interstage capacitor Cs is thus minimized, and as a result, the worst value of the noise factor of the first-stage amplifier in the operation band is minimized.

Based on the technical idea described above, fr<f1<fc<f2 is satisfied in the high-frequency, multistage, low-noise amplifier according to the first embodiment. The high-frequency, multistage, low-noise amplifier can thus have the band eliminating function while having a low noise factor and a flat gain characteristic over the range from the low frequency end to the high frequency end of the operation band.

The above description is also applicable to a configuration in which three or more amplifiers are connected in series to each other. That is, out of a plurality of bandpass filters in a multistage, low-noise amplifier including a band-rejection filter that resonates at a frequency lower than those in the operation band, the bandpass filter closest to the high-frequency input terminal T1 has a resonance frequency lower than the center value of the operation frequency, and the bandpass filter farthest from the high-frequency input terminal T1 has a resonance frequency higher than the center value of the operation frequency.

In the multistage circuit in which three or more amplifiers are connected in series to each other, when at least two of the amplifiers are each provided with a stabilizing circuit and a band-rejection filter that eliminates the frequencies lower than the operation frequency of the amplifier, and fr<f1<fc<f2 is satisfied, a low noise factor and a flat gain characteristic can be achieved over the range from the low frequency end to the high frequency end of the operation band.

As long as the condition of f1<f2 is satisfied, the effect of achieving a low noise factor at the low frequency end of the operation band is provided, and the condition f1<fc<f2 is added to the condition described above to improve the gain flatness in the operation band.

The effect described above is provided on the presumption that the condition of fr<fc is satisfied. In general, however, setting f1 at a value in the vicinity of the frequency range of the operation band to ensure the flat characteristic in the operation band, and causing the eliminated band to overlap with the operation band cannot both be achieved in a system using an amplifier. The condition of fr≤f1 is therefore added to the condition described above.

The variations, modifications, or alternatives described in the first embodiment are applicable to the high-frequency, multistage, low-noise amplifiers according to the following embodiments. The high-frequency, multistage, low-noise amplifiers according to the following embodiments will be primarily described about differences from the first embodiment.

Second Embodiment

The components of the high-frequency, multistage, low-noise amplifier according to a second embodiment are the same as those in the first embodiment. In the first embodiment, it is presumed that the band eliminated by the band-rejection filter is lower than the operation band, but not necessarily, and the eliminated band may be higher than the operation band. The first band-rejection filter Fe1 and the second band-rejection filter Fe2 in the second embodiment eliminate the frequencies higher than the operation frequency of the amplifier.

In the present embodiment, the resonance frequency f1 of the LC resonance circuit that forms the first stabilizing circuit S1 connected to the output side of the first transistor Tr1 disposed in the position closest to the high-frequency input terminal T1 is set at a value higher than the center value fc of the operation frequency of the amplifier, and the resonance frequency f2 of the LC resonance circuit that forms the second stabilizing circuit S2 connected to the output side of the second transistor Tr2 disposed in a position farther from the high-frequency input terminal T1 than the first transistor Tr1 is set at a value lower than the center value fc of the operation frequency of the amplifier. The frequency fr, at which the first band-rejection filter Fe1 and the second band-rejection filter Fe2 each produce the largest loss, is higher than the operation frequency of the amplifier. That is, the center value fc of the operation frequency and the resonance frequencies f1, f2, and fr are set so as to satisfy f2<fc<f1≤fr.

As long as the relationship described above in terms of magnitude of the frequencies in the second embodiment is satisfied, the same principle as that in the first embodiment allows the high-frequency, multistage, low-noise amplifier to have the band eliminating function while having a low noise factor and a flat gain characteristic over the range from the low frequency end to the high frequency end of the operation band.

The above description is also applicable to the configuration in which three or more amplifiers are connected in series to each other. That is, out of a plurality of bandpass filters, the bandpass filter closest to the high-frequency input terminal T1 has a resonance frequency higher than the center value of the operation frequency, and the bandpass filter farthest from the high-frequency input terminal T1 has a resonance frequency lower than the center value of the operation frequency. A multistage amplifier including a band-rejection filter that resonates at a frequency higher than those in the operation band can therefore also form a multistage, low-noise amplifier having a low noise factor and a flat gain characteristic over the range from the low frequency end to the high frequency end of the operation band.

In the multistage circuit in which three or more amplifiers are connected in series to each other, when at least two of the amplifiers are each provided with a stabilizing circuit and a band-rejection filter that eliminates the frequencies higher than the operation frequency of the amplifier, and f2<fc<f1 fr is satisfied, a low noise factor and a flat gain characteristic can be achieved over the range from the low frequency end to the high frequency end of the operation band.

Third Embodiment

Figure 7:
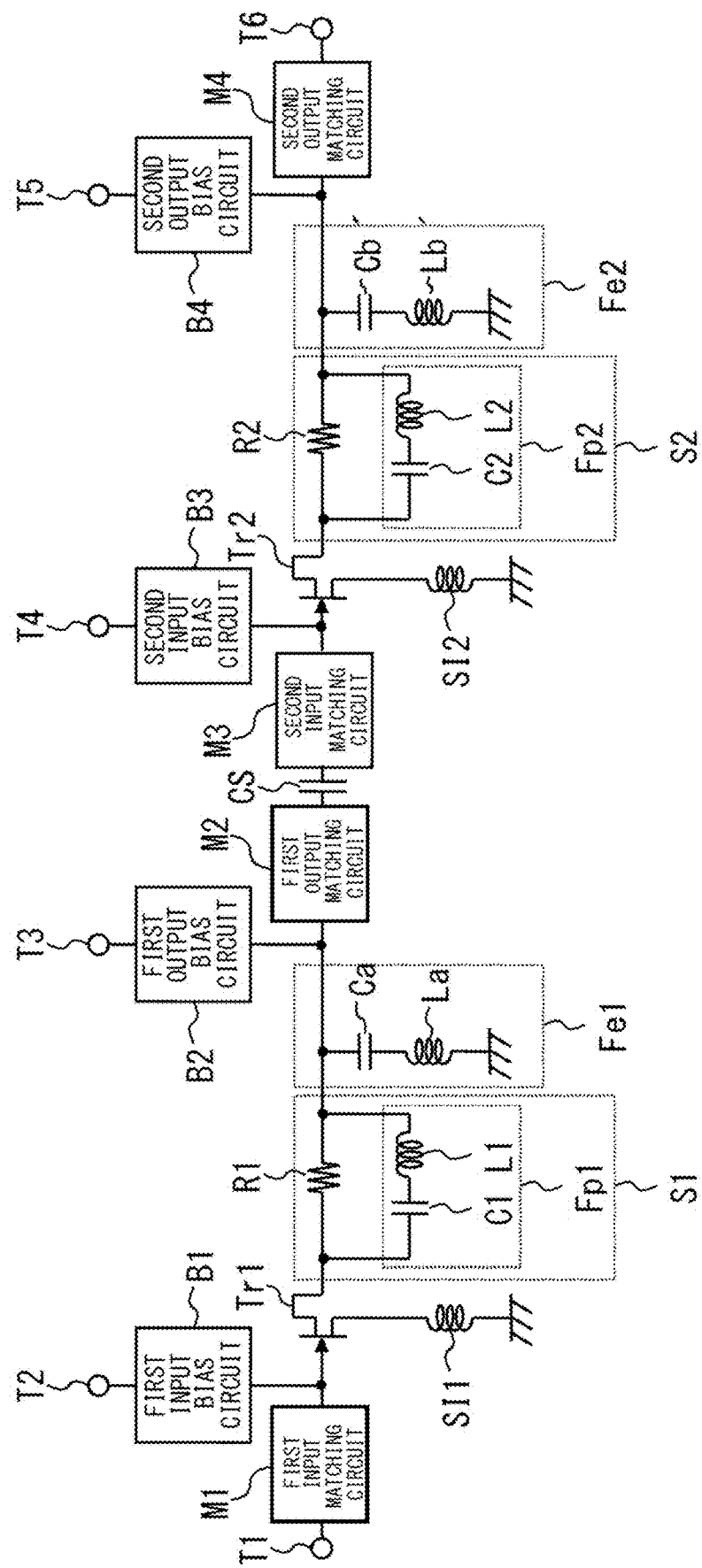
FIG. 7 is a configuration diagram of a high-frequency, multistage, low-noise amplifier according to a third embodiment.

FIG. 7 shows the configuration of a high-frequency, multistage, low-noise amplifier according to a third embodiment. The components in FIG. 7 are basically the same as the components in the first embodiment. In the first and second embodiments, it is presumed that the resonance frequency of the first band-rejection filter Fe1 and the resonance frequency of the second band-rejection filter Fe2 are equal to each other, but not necessarily. In the third embodiment, the second band-rejection filter Fe2 includes an inductor Lb' and a capacitor Cb', so that the second band-rejection filter Fe2 has a resonance frequency fs. The resonance frequency fs of the second band-rejection filter Fe2 is set at a value higher than the resonance frequency fr in the description of the first embodiment but lower than or equal to the resonance frequency f1.

That is, the resonance frequency f1 of the first bandpass filter Fp1, the resonance frequency f2 of the second bandpass filter Fp2, the center value fc of the operation frequency, the resonance frequency fr of the first band-rejection filter Fe1, and the resonance frequency fs of the second band-rejection filter Fe2 satisfy the following relationship:

$$fr<fs<f1<fc<f2$$

To describe the effect provided by the third embodiment, resuming the case in the first embodiment, examination will be made on the following three cases in which the resonance frequency fr of the first band-rejection filter Fe1 and the resonance frequency fs of the second band-rejection filter Fe2 are changed in terms of magnitude:

$$fr=fs<f1<fc<f2 \quad \text{Case (1)}$$

$$fs<fr<f1<fc<f2 \quad \text{Case (2)}$$

$$fr<fs<f1<fc<f2: \text{Third embodiment} \quad \text{Case (3)}$$

The three cases will be examined in conjunction with specific examples to see how the following values change: the circuit losses produced by the stabilizing circuits and the band-rejection filters; and the gain flatness and the noise factor in the operation band.

Figure 8:
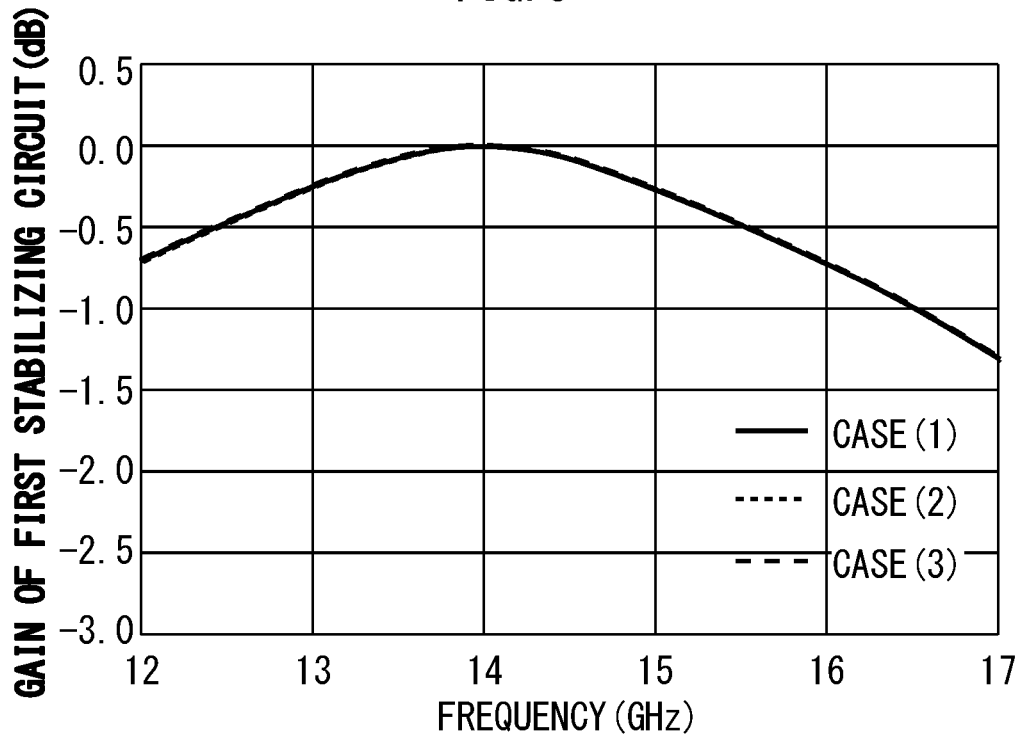
FIG. 8 shows the gain characteristics of the first stabilizing circuits according to the third embodiment and the comparative example.
Figure 9:
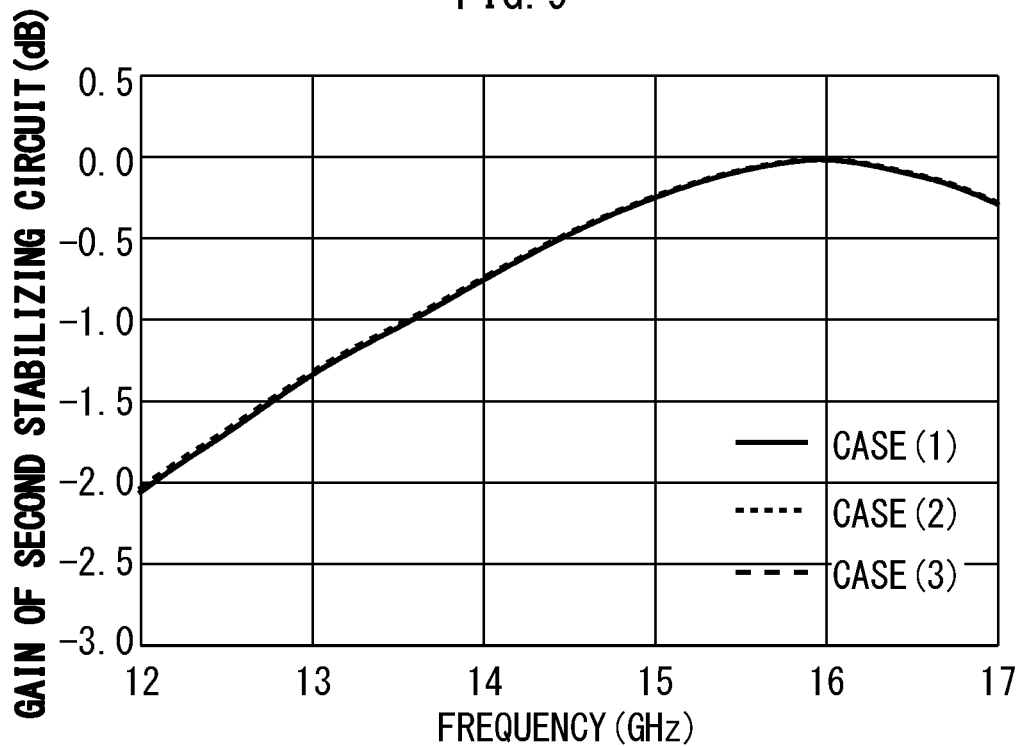
FIG. 9 shows the gain characteristics of the second stabilizing circuits according to the third embodiment and the comparative example.
Figure 10:
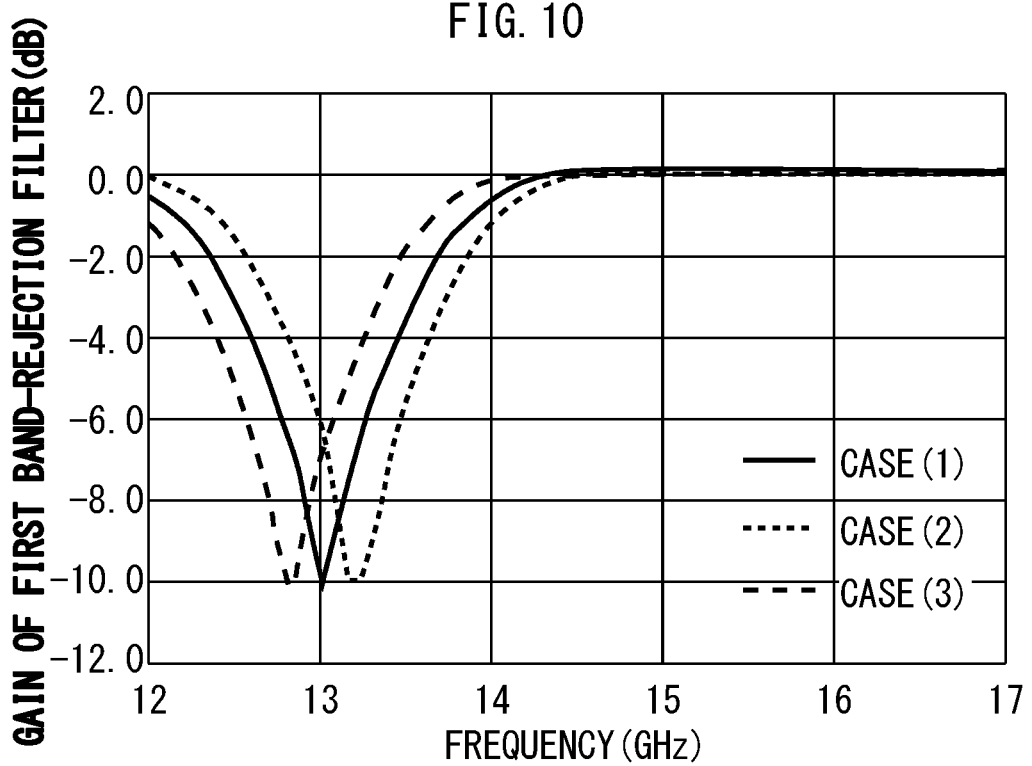
FIG. 10 shows the gain characteristics of the first band-rejection filters according to the third embodiment and the comparative example.
Figure 11:
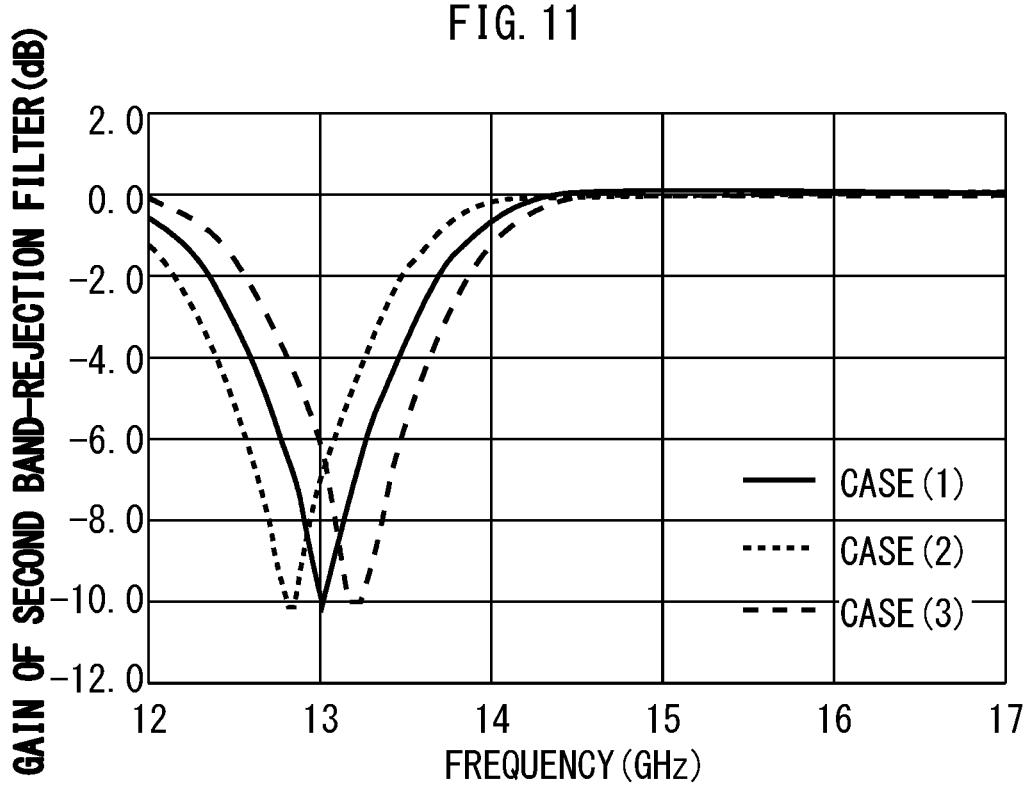
FIG. 11 shows the gain characteristics of the second band-rejection filters according to the third embodiment and the comparative example.

As in the examination made in the first embodiment, it is assumed that the operation band ranges from 14 to 16 GHz, and that the eliminated band is 13 GHz. FIG. 8 shows the gain characteristic of the first stabilizing circuit in the cases (1) to (3) described above. FIG. 9 shows the gain characteristic of the second stabilizing circuit in the cases (1) to (3) described above. FIG. 10 shows the gain characteristic of the first band-rejection filter in the cases (1) to (3) described above. FIG. 11 shows the gain characteristic of the second band-rejection filter in the cases (1) to (3) described above.

In the calculation example, the resonance frequencies of the LC resonance circuits that form the stabilizing circuits are so set that the first stabilizing circuit S1 produces a zero circuit loss at 14 GHz and the second stabilizing circuit produces a zero circuit loss at 16 GHz in any of the cases (1) to (3), as shown in FIGS. 8 and 9.

On the other hand, the amounts of attenuation provided by the band-rejection filters are differentiated among the cases (1) to (3). Specifically, both the first band-rejection filter Fe1 and the second band-rejection filter Fe2 provide a maximum amount of attenuation of 10 dB at 13 GHz in the case (1). In the case (2), the first band-rejection filter Fe1 provides the maximum amount of attenuation of 10 dB at 13.2 GHz, and the second band-rejection filter Fe2 provides the maximum amount of attenuation of 10 dB at 12.8 GHz. In the case (3), the first band-rejection filter Fe1 provides the maximum amount of attenuation of 10 dB at 12.8 GHz, and the second band-rejection filter Fe2 provides the maximum amount of attenuation of 10 dB at 13.2 GHz. The difference in the amount of attenuation is given by adjusting the resonance frequency of the LC resonance circuit that forms each of the band-rejection filters.

The amount of attenuation provided by each of the band-rejection filters at a frequency separate from the resonance frequency is assumed to be fixed in all the cases (1) to (3) when the difference in frequency from the resonance frequency is fixed. On the presumption described above, the gain and the noise factor of the multistage amplifier are calculated on the assumption that the gain of a single transistor is 10 dB and the noise factor is 0.6 dB irrespective of the frequency at each stage, and that there is no circuit loss excluding those produced by the stabilizing circuits and the band-rejection filters.

Figure 12:
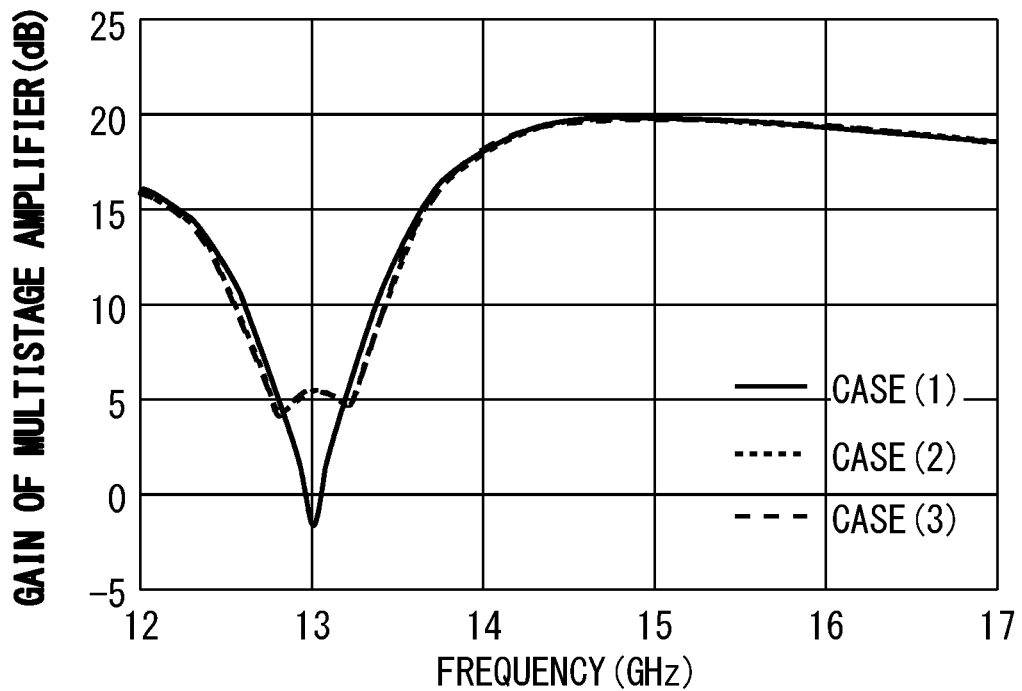
FIG. 12 shows the gains of the multistage amplifier according to the third embodiment and the comparative example.

FIG. 12 shows the gain of the multistage amplifier in the cases (1) to (3) described above. When the attenuation characteristics of the first band-rejection filter Fe1 and the second band-rejection filter Fe2 are added to each other, it can be seen that the frequency range of the eliminated band where the gain of the multistage amplifier is, for example, 10 dB or smaller is wider in the cases (2) and (3) than in the case (1). As described above, the present embodiment, which corresponds to the case (3), also provides the effect of broadening the band over which the attenuation characteristic of each of the filters is achieved.

Figure 13:
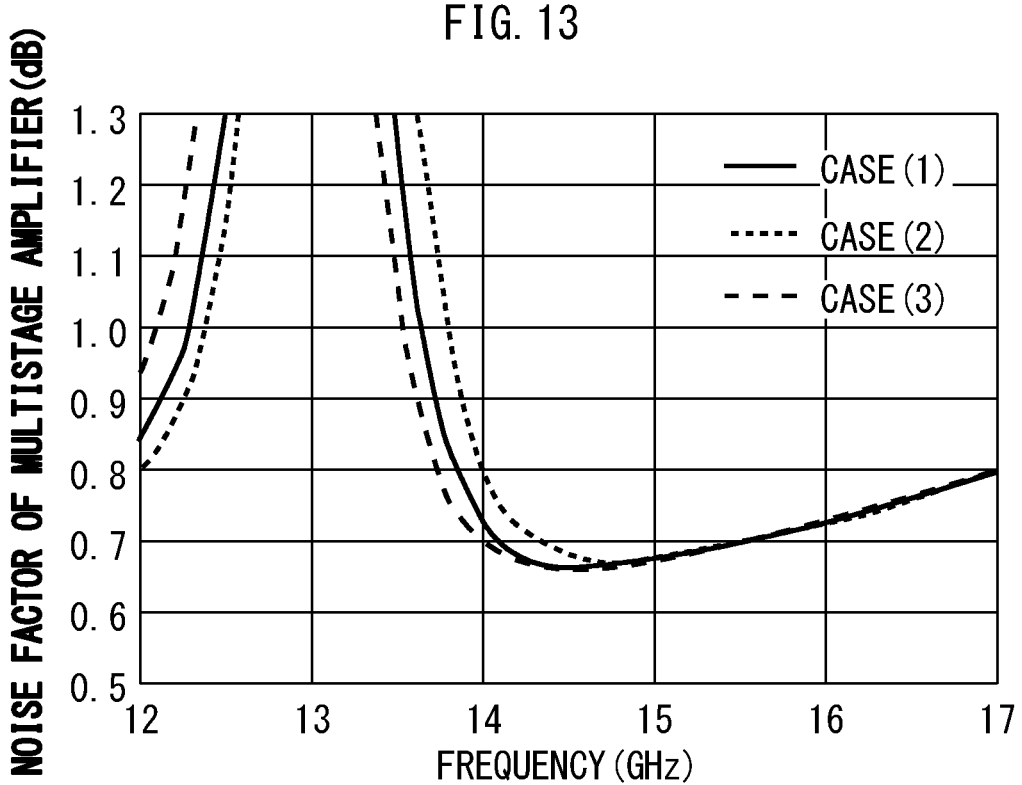
FIG. 13 shows the noise factors of the multistage amplifiers according to the third embodiment and the comparative example.

FIG. 13 shows the noise factor of the multistage amplifier in the cases (1) to (3) described above. The noise factor at 14 GHz is 0.74 dB in the case (1) and 0.81 dB in the case (2), whereas 0.70 dB in the case (3). The reason for this is that the same principle as that described in the first embodiment shifts the circuit loss produced by the first band-rejection filter Fe1 toward the low frequency side to minimize the circuit loss produced by the portion from the output terminal of the first transistor Tr1 to the interstage capacitor Cs at 14 GHz, so that the noise factor of the first-stage amplifier is minimized.

As described above, in the third embodiment, in which the resonance frequency fs of the second band-rejection filter Fe2 is higher than the resonance frequency fr of the first band-rejection filter Fe1 but lower than or equal to the frequency f1, the multistage amplifier can have a low noise factor over the range from the low frequency end to the high frequency end of the operation band, and further have a broadband eliminated-band attenuation characteristic as compared with the multistage amplifier in the first embodiment.

The above description has been made with reference to an example of the two-stage amplifier configuration, and the aforementioned technology for adjusting the resonance frequency of a band-rejection filter is also applicable to the configuration having three or more stages of amplifiers. In this case, a plurality of band-rejection filters each have a resonance frequency lower than or equal to the resonance frequency f1 of the first bandpass filter Fp1, which is closest to the high-frequency input terminal T1. Furthermore, the closer to the high-frequency input terminal T1 any of the plurality of band-rejection filters is, the lower the resonance frequency of the band-rejection filter is.

The third embodiment has been described with reference to the case where a band-rejection filter eliminates power at the frequencies lower than the operation frequency, and the technology for adjusting the resonance frequency of a band-rejection filter described in the third embodiment is also applicable to a case where a band-rejection filter eliminates power at the frequencies higher than the operation frequency. For example, in the high-frequency, multistage, low-noise amplifier shown in the second embodiment, setting the resonance frequency of the second band-rejection filter Fe2 at a value lower than the frequency fr but higher than or equal to the frequency f1 allows the multistage amplifier to have a low noise factor over the range from the low frequency end to the high frequency end of the operation band, and further have a broadband eliminated-band attenuation characteristic as compared with the multistage amplifier in the second embodiment. Furthermore, in the case where a band-rejection filter eliminates power at the frequencies higher than the operation frequency in the configuration including three or more stages of amplifiers, a plurality of band-rejection filters each have a resonance frequency higher than or equal to the resonance frequency of the bandpass filter closest to the high-frequency input terminal T1. The closer to the high-frequency input terminal T1 any of the plurality of band-rejection filters is, the higher the resonance frequency of the band-rejection filter is.

Fourth Embodiment

In the first to third embodiments, it is presumed that the first band-rejection filter and the second band-rejection filter have the same attenuation characteristic, that is, the same dependency of the amount of attenuation on the difference in frequency from the resonance frequency, but not necessarily. Therefore, in the fourth embodiment, the attenuation characteristic of the first band-rejection filter Fe1 is set to be steeper than that of the second band-rejection filter Fe2. The high-frequency, multistage, low-noise amplifier according to the fourth embodiment has the same device configuration as that in the first embodiment, and the set frequencies are the same as those in the first embodiment in terms of magnitude.

To describe the effect provided by the fourth embodiment, resuming the case in the first embodiment, examination will be made on the following three cases in which the steepness of the attenuation characteristic of the first band-rejection filter Fe1 and the steepness of the attenuation characteristic of the second band-rejection filter Fe2 are changed.

Case (1) The attenuation characteristic of the first band-rejection filter is as steep as the attenuation characteristic of the second band-rejection filter.

Case (2) The attenuation characteristic of the second band-rejection filter is steeper than the attenuation characteristic of the first band-rejection filter.

Case (3) The attenuation characteristic of the first band-rejection filter is steeper than the attenuation characteristic of the second band-rejection filter: Fourth embodiment The cases described above will be examined in conjunction with specific examples to see how the following values change: the circuit losses produced by the stabilizing circuits and the band-rejection filters; and the gain flatness and the noise factor in the operation band.

As in the examination made in the first embodiment, it is assumed that the operation band ranges from 14 to 16 GHz, and the eliminated band is 13 GHz. FIG. 8 shows the gain characteristic of the first stabilizing circuit in the cases (1) to (3) described above, and FIG. 9 shows the gain characteristic of the second stabilizing circuit in the cases (1) to (3) described above.

Figure 14:
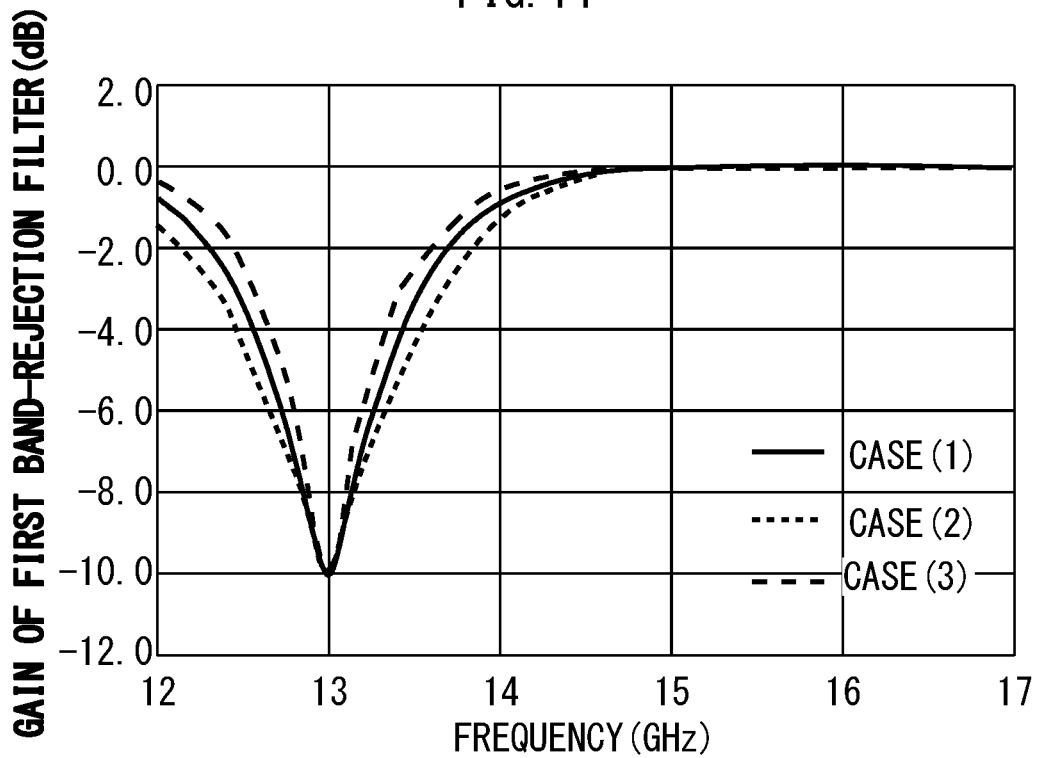
FIG. 14 shows the gain characteristics of the first band-rejection filters according to a fourth embodiment and the comparative example.
Figure 15:
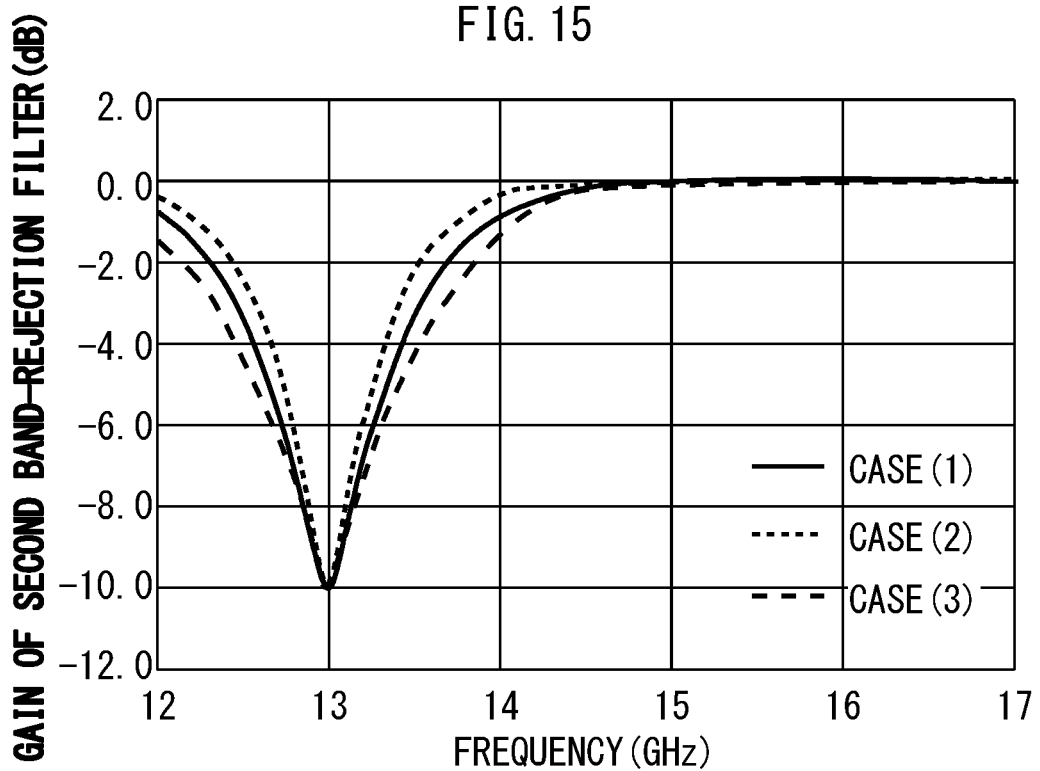
FIG. 15 shows the gain characteristics of the second band-rejection filters according to the fourth embodiment and the comparative example.

FIG. 14 shows the gain characteristic of the first band-rejection filter in the cases (1) to (3) described above. FIG. 15 shows the gain characteristic of the second band-rejection filter in the cases (1) to (3) described above. In the calculation example, the resonance frequencies of the LC resonance circuits that form the stabilizing circuits are so set that the first stabilizing circuit produces a zero circuit loss at 14 GHz and the second stabilizing circuit produces a zero circuit loss at 16 GHz in any of the cases (1) to (3).

The first and second band-rejection filters each provide the maximum amount of attenuation of 10 dB at 13 GHz in any of the cases (1) to (3), but differ from each other in the steepness thereof. A larger amount of attenuation or a steeper attenuation characteristic means that the full width at half maximum is smaller. In the case (1), the amount of attenuation of the first band-rejection filter is as steep as the amount of attenuation of the second band-rejection filter. In the case (2), the amount of attenuation of the second band-rejection filter is steeper than the amount of attenuation of the first band-rejection filter. In the case (3), the amount of attenuation of the first band-rejection filter is steeper than the amount of attenuation of the second band-rejection filter. In other words, the band-rejection filters provide the same amount of attenuation at the frequencies separate from the resonance frequency in the case (1), but in the case (2), the first band-rejection filter provides a larger amount of attenuation, and in the case (3), the first band-rejection filter provides a smaller amount of attenuation.

On the presumption described above, the gain and the noise factor of the multistage amplifier are calculated on the assumption that the gain of a single transistor is 10 dB and the noise factor is 0.6 dB irrespective of the frequency at each stage, and that there is no circuit loss excluding those produced by the stabilizing circuits and the band-rejection filters.

Figure 16:
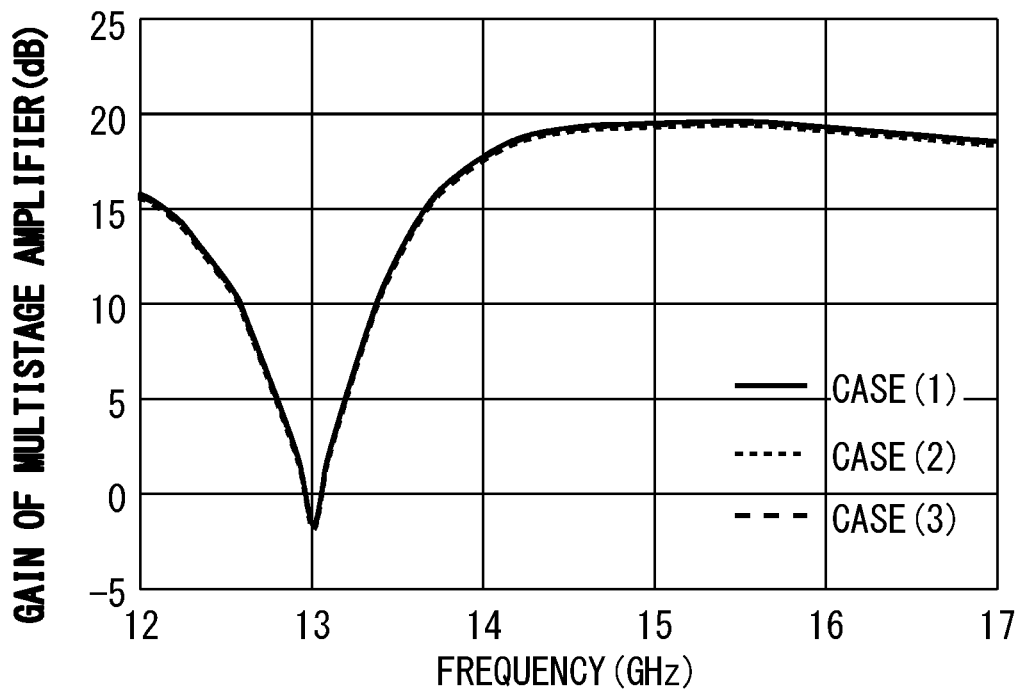
FIG. 16 shows the gains of the multistage amplifiers according to the fourth embodiment and the comparative example.

FIG. 16 shows the gain of the multistage amplifier in the cases (1) to (3) described above. When the attenuation characteristics of the first and second band-rejection filters are added to each other, the amount of attenuation in the vicinity of the eliminated band is fixed in all the cases (1) to (3). That is, the bandwidth of the attenuation characteristic of the multistage amplifier shown in the first embodiment can be maintained.

Figure 17:
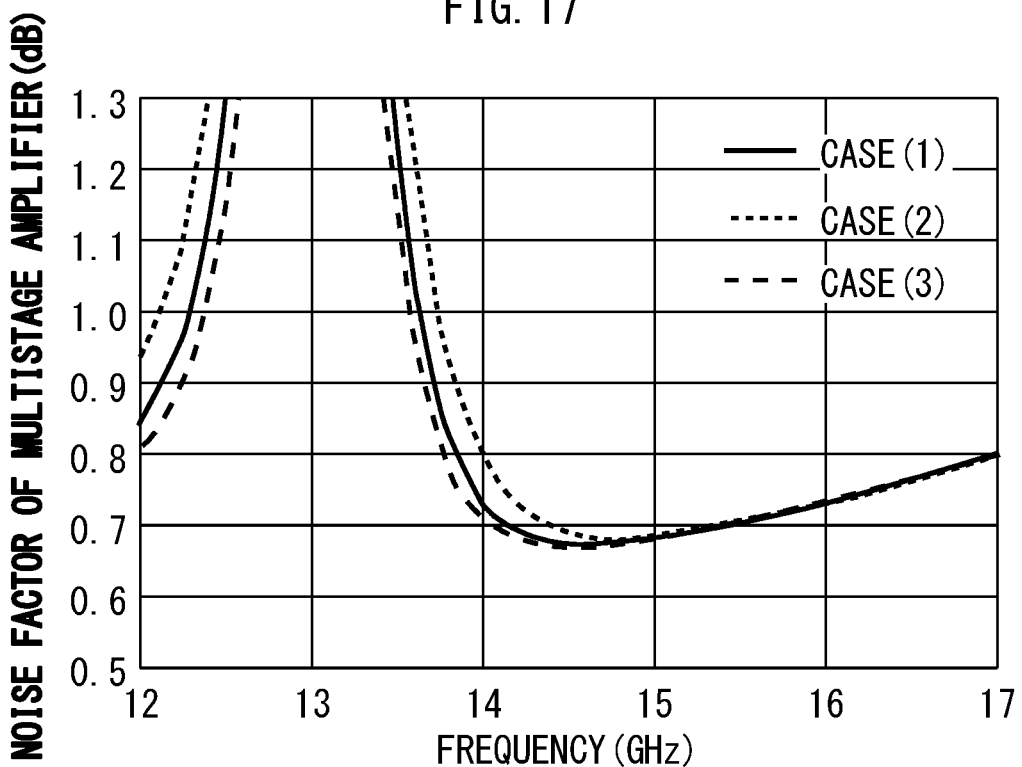
FIG. 17 shows the noise factors of the multistage amplifiers according to the fourth embodiment and the comparative example.

FIG. 17 shows the noise factor of the multistage amplifier in the cases (1) to (3) described above. The noise factor at 14 GHz is 0.74 dB in the case (1) and 0.81 dB in the case (2), whereas 0.71 dB in the case (3). The reason for this is that based on the same principle as that described in the first embodiment, the first band-rejection filter is set to have a steep characteristic of the circuit loss to minimize the circuit loss produced by the portion from the output terminal of the first transistor Tr1 to the interstage capacitor Cs at 14 GHz, so that the noise factor of the first-stage amplifier is minimized.

As described above, in the multistage amplifier shown in the fourth embodiment, in which the first band-rejection filter Fe1 is set to have a steeper attenuation characteristic than the attenuation characteristic of the second band-rejection filter Fe2, the multistage amplifier can have a low noise factor over the range from the low frequency end to the high frequency end of the operation band with the bandwidth of the attenuation characteristic in the eliminated band maintained, as compared with the multistage amplifier in the first embodiment.

The fourth embodiment has been described with reference to the high-frequency, multistage, low-noise amplifier including two amplifiers, and the technology for adjusting the steepness of the amount of attenuation provided by a band-rejection filter is also applicable to a high-frequency, multistage, low-noise amplifier including three or more stages of amplifiers. According to one example, out of three or more band-rejection filters, the closer to the high-frequency input terminal T1 a band-rejection filter is, the steeper the attenuation characteristic is. According to another example, out of the three or more band-rejection filters, the filter closest to the high-frequency input terminal T1 has the steepest attenuation characteristic, and the other band-rejection filters have less steep attenuation characteristics than that of the closest band-rejection filter.

Fifth Embodiment

The first to fourth embodiments have been described with reference primarily to a two-stage amplifier formed of a first-stage amplifier and a second-stage amplifier, and a high-frequency, multistage, low-noise amplifier including three or more stages of amplifiers connected in series to each other may be provided.

Figure 18:
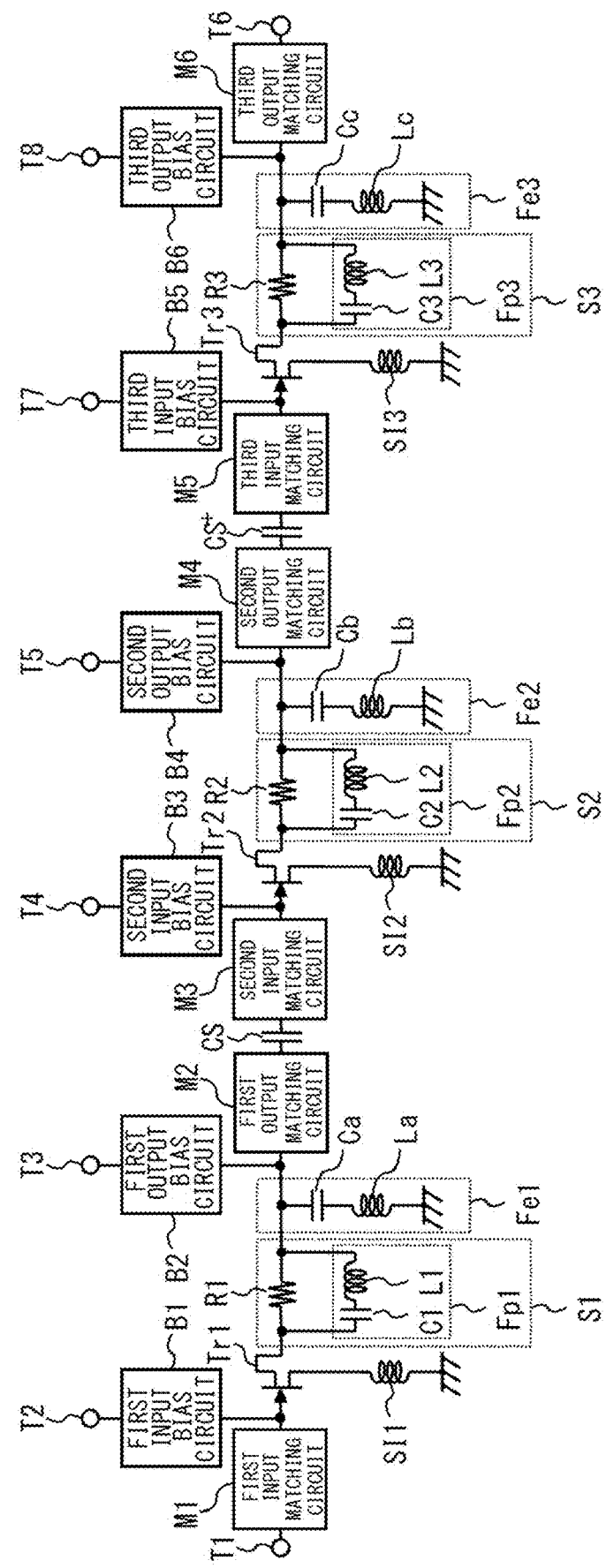
FIG. 18 is a configuration diagram of a high-frequency, multistage, low-noise amplifier according to a fifth embodiment.

FIG. 18 shows a high-frequency, multistage, low-noise amplifier according to a fifth embodiment. The portion from the first input matching circuit M1 to the first output matching circuit M2 is a first-stage amplifier, the portion from the second input matching circuit M3 to the second output matching circuit M4 is a second-stage amplifier, and the portion from a third input matching circuit M5 to a third output matching circuit M6 is a third-stage amplifier. The configurations of the first-stage amplifier and the second-stage amplifier are the same as the configurations in the first to fourth embodiments. The third-stage amplifier has the same configuration as the configuration of the first-stage amplifier.

The third stabilizing circuit S3 has a configuration in which a resonance circuit in which a third inductor L3, which resonates at a frequency f3, and a third capacitor C3 are connected in series to each other is connected in parallel to a third resistor R3. The first band-rejection filter Fe1 is formed of a resonance circuit in which the inductor La and the capacitor Ca are connected in series to each other and which is shunt-connected, and resonates at the frequency fr. The second band-rejection filter Fe2 is formed of a resonance circuit in which the inductor Lb and the capacitor Cb are connected in series to each other and which is shunt-connected, and the third band-rejection filter Fe3, which resonates at the frequency fs, is formed of a resonant circuit in which an inductor Lc and a capacitor Cc are connected in series to each other and which is shunt-connected, and resonates at a frequency ft.

When a band-rejection filter having a resonance frequency lower than those in the operation band of the amplifier is disposed, the closer to the high-frequency input terminal the amplification stage is, the lower the resonance frequency of the series resonance circuit that forms the stabilizing circuit is set to. That is, the closer to the high-frequency input terminal T1 the bandpass filter is, the lower the resonance frequency of the bandpass filter is. The situation described above is expressed by the following expression:

$$fr, fs, ft \leq f1 < f2 < f3$$

On the other hand, when a band-rejection filter having a resonance frequency higher than those in the operation band of the amplifier is disposed, the closer to the high-frequency input terminal the amplification stage is, the higher the resonance frequency of the series resonance circuit that forms the stabilizing circuit is set to. That is, the closer to the high-frequency input terminal T1 the bandpass filter is, the higher the resonance frequency of the bandpass filter is. The situation described above is expressed by the following expression:

$$f3 < f2 < f1 \leq fr, fs, ft$$

The noise factor of an n-stage (n is natural number) amplifier is calculated by the following expression, which is extended from Expression 1.

$$F = F1 + (F2-1)/G1 + (F3-1)/G1G2 + \ldots + (Fn-1)/G1G2\ldots Gn-1 \quad \text{(Expression 2)}$$

where F represents the noise factor of the multistage amplifier, F1, F2, F3, . . . , Fn represent the noise factors of the first-stage to the n-th-stage amplifiers, and G1, G2, . . . , Gn represent the gains of the first-stage to the n-th-stage amplifiers.

According to Expression 2, even when the total circuit loss produced by the multistage circuit is fixed, the noise factor of the multistage amplifier worsens because the larger the circuit loss produced by an amplifier close to the high-frequency input terminal T1, the worse the noise factor of the multistage amplifier. In other words, if the circuit loss of an amplifier close to the high-frequency input terminal can be reduced, the noise factor of the multistage amplifier can be improved even when the sum of the circuit losses produced by all the stages is fixed.

As described above, according to an example,
in a multistage, low-noise amplifier including a band-rejection filter that resonates at a frequency lower than those in an operation band, the resonance frequency of an LC resonance circuit that forms a stabilizing circuit connected to the output side of a transistor closest to a high-frequency input terminal is set at a value smaller than the center value of the operation frequency of the amplifier, and the resonance frequency of an LC resonance circuit that forms a stabilizing circuit connected to the output side of a transistor disposed on the downstream of the transistor and being farther from the high-frequency input terminal is set at a successively higher value, or in a multistage, low-noise amplifier including a band-rejection filter that resonates at a frequency higher than those in the operation band, the resonance frequency of an LC resonance circuit that forms a stabilizing circuit connected to the output side of a transistor closest to a high-frequency input terminal is set at a value greater than the center value of the operation frequency of the amplifier, and the resonance frequency of an LC resonance circuit that forms a stabilizing circuit connected to the output side of a transistor disposed on the downstream of the transistor and being farther from the high-frequency input terminal is set at a successively lower value, whereby the multistage, low-noise amplifier can have a low noise factor and a flat gain characteristic over the range from the low frequency end to the high frequency end of the operation band and further have a band eliminating function.

A stabilizing circuit and a band-rejection filter may be disposed in each of the amplifiers that form the multistage amplifier, but not necessarily, and a stabilizing circuit and a band-rejection filter may be disposed in a specific amplifier, but may not be disposed in the other amplifiers. For example, the technology according to the present embodiment may be applied to the first to third amplifiers out of four stages of amplifiers, and the fourth-stage amplifier may not include a stabilizing circuit and/or a band-rejection filter.

REFERENCE SIGNS LIST

T1 high-frequency input terminal; M1 first input matching circuit; S1 first stabilizing circuit; Fe1 first band-rejection filter; M2 first output matching circuit; M3 second input matching circuit; S2 second stabilizing circuit; Fe2 second band-rejection filter; M4 second output matching circuit; T6 high-frequency output terminal

The invention claimed is:

1. A high-frequency, multistage, low-noise amplifier comprising:
   a high-frequency input terminal;
   a high-frequency output terminal;
   a multistage circuit provided between the high-frequency input terminal and the high-frequency output terminal and including two or more amplifiers connected in series to each other, each amplifier including an input matching circuit, a transistor, and an output matching circuit;
   a stabilizing circuit provided in each of at least two of the amplifiers of the multistage circuit and including a bandpass filter and a resistor connected in parallel to each other; and
   a band-rejection filter provided between the at least two of the amplifiers and eliminating a frequency lower than an operation frequency of the amplifier,
   wherein the stabilizing circuit and the band-rejection filter are provided between an output terminal of the transistor of the amplifier and the output matching circuit or provided in the output matching circuit, and
   the closer to the high-frequency input terminal a respective bandpass filter among the bandpass filters is, the lower a resonance frequency of the respective bandpass filter is, with respect to the bandpass filters included in the stabilizing circuits.

2. The high-frequency, multistage, low-noise amplifier according to claim 1, wherein the bandpass filter closest to the high-frequency input terminal has a resonance frequency lower than a center value of the operation frequency, and
   the bandpass filter farthest from the high-frequency input terminal has a resonance frequency higher than the center value.

3. The high-frequency, multistage, low-noise amplifier according to claim 1, wherein the band-rejection filter has a resonance frequency lower than or equal to a resonance frequency of the bandpass filter closest to the high-frequency input terminal.

4. The high-frequency, multistage, low-noise amplifier according to claim 1, further comprising another band-rejection filter provided between the at least two of the amplifiers and the high-frequency output terminal,
   wherein the closer to the high-frequency input terminal a respective band-rejection filter among the band-rejection filters is, the lower a resonance frequency of the respective band-rejection filter is, with respect to the band-rejection filters.

5. A high-frequency, multistage, low-noise amplifier comprising:
   a high-frequency input terminal;
   a high-frequency output terminal;
   a multistage circuit provided between the high-frequency input terminal and the high-frequency output terminal and including two or more amplifiers connected in series to each other, each amplifier including an input matching circuit, a transistor, and an output matching circuit;
   a stabilizing circuit provided in each of at least two of the amplifiers of the multistage circuit and including a bandpass filter and a resistor connected in parallel to each other; and
   a band-rejection filter provided between the at least two of the amplifiers and eliminating a frequency higher than an operation frequency of the amplifier,
   wherein the stabilizing circuit and the band-rejection filter are provided between an output terminal of the transistor of the amplifier and the output matching circuit or provided in the output matching circuit, and
   the closer to the high-frequency input terminal a respective bandpass filter among the bandpass filters is, the higher a resonance frequency of the respective bandpass filter is, with respect to the bandpass filters included in the stabilizing circuits.

6. The high-frequency, multistage, low-noise amplifier according to claim 5, wherein the bandpass filter closest to the high-frequency input terminal has a resonance frequency higher than a center value of the operation frequency, and
   the bandpass filter farthest from the high-frequency input terminal has a resonance frequency lower than the center value.

7. The high-frequency, multistage, low-noise amplifier according to claim 5, wherein the band-rejection filter has a resonance frequency higher than or equal to a resonance frequency of the bandpass filter closest to the high-frequency input terminal.

8. The high-frequency, multistage, low-noise amplifier according to claim 5, further comprising another band-rejection filter provided between the at least two of the amplifiers and the high-frequency output terminal,
> wherein the closer to the high-frequency input terminal a respective band-rejection filter among the band-rejection filters is, the higher a resonance frequency of the respective band-rejection filter is, with respect to the band-rejection filters.

9. The high-frequency, multistage, low-noise amplifier according to claim 1, further comprising another band-rejection filter provided between the at least two of the amplifiers and the high-frequency output terminal,
> wherein the closer to the high-frequency input terminal a respective band-rejection filter among the band-rejection filters is, the steeper an attenuation characteristic of the respective band-rejection filter is, with respect to the band-rejection filters.

10. The high-frequency, multistage, low-noise amplifier according to claim 5, further comprising another band-rejection filter provided between the at least two of the amplifiers and the high-frequency output terminal,
> wherein the closer to the high-frequency input terminal a respective band-rejection filter among the band-rejections filters is, the steeper an attenuation characteristic of the respective band-rejection filter is, with respect to the band-rejection filters.

* * * * *